US012706137B2

(12) United States Patent
Zhu et al.

(10) Patent No.: US 12,706,137 B2
(45) Date of Patent: Aug. 11, 2026

(54) MEMORY AND ACCESS METHOD THEREFOR, AND ELECTRONIC DEVICE

(71) Applicant: BEIJING SUPERSTRING ACADEMY OF MEMORY TECHNOLOGY, Beijing (CN)

(72) Inventors: Zhengyong Zhu, Beijing (CN); Bokmoon Kang, Beijing (CN); Dan Wang, Beijing (CN); Chao Zhao, Beijing (CN)

(73) Assignee: BEIJING SUPERSTRING ACADEMY OF MEMORY TECHNOLOGY, Beijing (CN)

( * ) Notice: Subject to any disclaimer, the term of this patent is extended or adjusted under 35 U.S.C. 154(b) by 133 days.

(21) Appl. No.: 18/714,879

(22) PCT Filed: Dec. 5, 2022

(86) PCT No.: PCT/CN2022/136593
§ 371 (c)(1),
(2) Date: May 30, 2024

(87) PCT Pub. No.: WO2024/007521
PCT Pub. Date: Jan. 11, 2024

(65) Prior Publication Data

US 2025/0029653 A1 Jan. 23, 2025

(30) Foreign Application Priority Data

Jul. 7, 2022 (CN) ........................ 202210804207.9

(51) Int. Cl.
*G11C 11/4096* (2006.01)
*G11C 11/4074* (2006.01)
(Continued)

(52) U.S. Cl.
CPC ...... *G11C 11/4096* (2013.01); *G11C 11/4074* (2013.01); *G11C 11/4085* (2013.01); *G11C 11/4091* (2013.01); *G11C 11/4094* (2013.01)

(58) Field of Classification Search
CPC ............ G11C 11/4096; G11C 11/4074; G11C 11/4085; G11C 11/4091; G11C 11/4094; G11C 11/419; G11C 11/401; Y02D 10/00
(Continued)

(56) References Cited

U.S. PATENT DOCUMENTS 11,783,891 B2 * 10/2023 Ramaraju .............. G11C 7/065 365/207
2006/0227648 A1 10/2006 Kameshiro et al.
(Continued)

FOREIGN PATENT DOCUMENTS

CN 1845330 A 10/2006
CN 101026004 A 8/2007
(Continued)

OTHER PUBLICATIONS

International Search Report for related PCT Application No. PCT/CN2022/136593 issued on Mar. 29, 2023, 15 pages.
(Continued)

*Primary Examiner* — Amir Zarabian
*Assistant Examiner* — Minh Dinh
(74) *Attorney, Agent, or Firm* — Tucker Ellis LLP

(57) ABSTRACT

Provided is a memory. The memory includes at least one memory array and at least one control circuit, wherein the memory array comprises a plurality of memory cells arranged in an array as well as read wordlines and read bitlines for read operations, wherein each of the memory cells comprises a first transistor and a second transistor. The control circuit is configured to transmit, during a pre-processing stage, a first voltage to the read wordline and the
(Continued)

read bitline; transmit, during a pre-charging stage, a second voltage to the read bitline; and transmit, during a read-sensing stage, a third voltage to the read wordline.

20 Claims, 9 Drawing Sheets

(51) Int. Cl.

| | |
|---|---|
| ***G11C 11/408*** | (2006.01) |
| ***G11C 11/4091*** | (2006.01) |
| ***G11C 11/4094*** | (2006.01) |

(58) Field of Classification Search
USPC .................................................... 365/189.15
See application file for complete search history.

(56) References Cited

U.S. PATENT DOCUMENTS

| | | | |
|---|---|---|---|
| 2007/0195626 | A1 | 8/2007 | Kim et al. |
| 2010/0165704 | A1 | 7/2010 | Wu et al. |
| 2015/0170730 | A1 | 6/2015 | Antonyan |
| 2016/0118108 | A1 | 4/2016 | Yamamoto |
| 2016/0254060 | A1 | 9/2016 | Pi et al. |
| 2017/0337950 | A1 | 11/2017 | Ahn et al. |
| 2023/0215503 | A1 | 7/2023 | Gu et al. |

FOREIGN PATENT DOCUMENTS

| | | | | |
|---|---|---|---|---|
| CN | 103123805 | A | 5/2013 | |
| CN | 104715781 | A | 6/2015 | |
| CN | 105340018 | A | 2/2016 | |
| CN | 105378841 | A | 3/2016 | |
| CN | 107403634 | A | 11/2017 | |
| CN | 110428858 | * | 11/2019 | ........... G11C 11/419 |
| CN | 114582398 | A | 6/2022 | |
| CN | 115171751 | A | 10/2022 | |

OTHER PUBLICATIONS

Hyungrock Oh et al., "Enhanced data integrity of In—Ga—Zn-Oxide based Capacitor-less 2T memory for DRAM applications," ESSDERC 2021—IEEE 51st European Solid-State Device Research Conference (ESSDERC), Dec. 13, 2021, pp. 275-278, <DOI: 10.1109/ESSDERC53440.2021.9631811.>.

China National Intellectual Property Administration, First office action of Chinese application No. 202210804207.9 issued on Dec. 5, 2022, which is foreign counterpart application of this US application (23 pages).

China National Intellectual Property Administration, Second office action of Chinese application No. 202210804207.9 issued on Feb. 5, 2023, which is foreign counterpart application of this US application (24 pages).

* cited by examiner

VDD
21
S3
S4
VOUT1
VOUT2
S5
S6
S1
S2
T5
VIN
SEN
VREF
GND

MEMORY AND ACCESS METHOD THEREFOR, AND ELECTRONIC DEVICE

CROSS-REFERENCE TO RELATED APPLICATIONS

This application is a U.S. national stage of International Application No. PCT/CN2022/136593, filed on Dec. 5, 2022, which claims priority to Chinese Patent Application No. 202210804207.9, filed on Jul. 7, 2022, the contents of which are incorporated herein by reference in their entireties.

TECHNICAL FIELD

The present disclosure relates to the field of memories, and in particular, relates to a memory and a method for accessing a memory, and an electronic device.

BACKGROUND

In some traditional dynamic random access memories (DRAMs), a memory cell consists of a transistor and a capacitor. Due to the leakage in the transistor, the stored data needs to be refreshed frequently, significantly increasing power consumption.

Metal oxide (e.g., IGZO) transistors have gained widespread attention for their potential applications due to their lower leakage compared to silicon-based MOSFETs. By replacing traditional silicon-based MOSFETs with low leakage current metal oxide TFTs, the refresh frequency can be significantly reduced, resulting in power savings.

SUMMARY

The present disclosure provides a memory and a method for accessing a memory, and an electronic device.

In a first aspect, embodiments of the present disclosure provide a memory. The memory includes at least one memory array and at least one control circuit, wherein

- the memory array includes a plurality of memory cells arranged in an array as well as read wordlines and read bitlines for read operations, wherein each of the memory cells includes a first transistor and a second transistor, with a gate of the second transistor connected to a first electrode of the first transistor, a first electrode of the second transistor connected to one of the read wordlines, and a second electrode of the second transistor connected to one of the read bitlines;
- the control circuit is connected to the read wordline and the read bitline;
- the control circuit is configured to transmit, during a pre-processing stage, a first voltage to the read wordline and the read bitline; transmit, during a pre-charging stage, a second voltage to the read bitline; and transmit, during a read-sensing stage, a third voltage to the read wordline.

In a second aspect, the embodiments of the present disclosure provide an electronic device. The electronic device includes a memory, wherein the memory comprises at least one memory array and at least one control circuit, wherein

- the memory array comprises a plurality of memory cells arranged in an array as well as read wordlines and read bitlines for read operations, wherein each of the memory cells comprises a first transistor and a second transistor, with a gate of the second transistor connected to a first electrode of the first transistor, a first electrode of the second transistor connected to one of the read wordlines, and a second electrode of the second transistor connected to one of the read bitlines;
- the control circuit is connected to the read wordline and the read bitline;
- the control circuit is configured to transmit, during a pre-processing stage, a first voltage to the read wordline and the read bitline; transmit, during a pre-charging stage, a second voltage to the read bitline; and transmit, during a read-sensing stage, a third voltage to the read wordline.

In a third aspect, the embodiments of the present disclosure provide a method for accessing a memory. The method includes:

- pre-processing, during a pre-processing stage, a memory array and transmitting a first voltage to a plurality of read wordlines and a plurality of read bitlines, wherein the memory array comprises a plurality of memory cells arranged in an array;
- pre-charging, during a pre-charging stage, the read bitlines connected to memory cells, wherein a pre-charging voltage is a second voltage; and
- outputting, during a read-sensing stage, a third voltage to the read wordlines connected to the memory cells, and accessing the memory cells based on changes in electrical signals on the read bitlines.

BRIEF DESCRIPTION OF THE DRAWINGS

The above and/or additional aspects and advantages of the present disclosure will become apparent and readily understood from the following description of embodiments in conjunction with the accompanying drawings. In the accompanying drawings.

DETAILED DESCRIPTION

Figure 1:
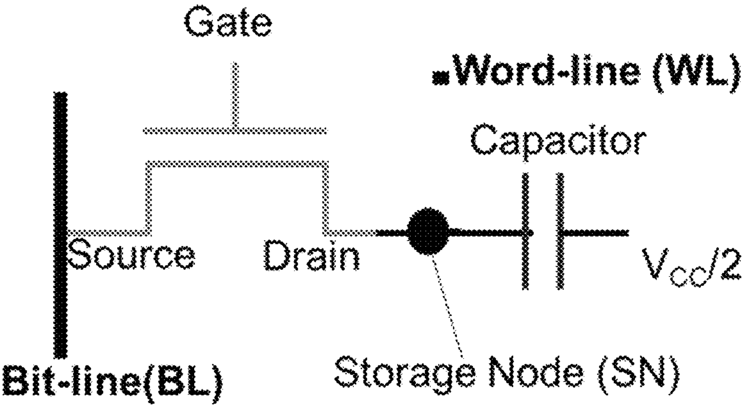
FIG. 1 is a structural schematic diagram of a conventional 1T1C memory cell.

A detailed description of the present disclosure is provided below. Examples of embodiments of the present disclosure are illustrated in the accompanying drawings, wherein the same or similar reference numerals indicate the same or similar components or components with the same or similar functions throughout. Furthermore, detailed descriptions of well-known technologies are omitted if they are not necessary for illustrating the characteristics of the present disclosure. The embodiments described below with reference to the accompanying drawings are exemplary and are intended to be used only for explaining the present disclosure, and are not to be construed as a limitation of the present disclosure.

Those skilled in the art will understand that, unless otherwise defined, all terms used herein (including technical and scientific terms) have the same meaning as commonly understood by one of ordinary skill in the art to which the present disclosure belongs. It should also be understood that terms defined in common dictionaries should be interpreted as having a meaning that is consistent with their meaning in the context of the prior art, and will not be interpreted in an idealized or overly formalized sense unless specifically defined as herein.

Those skilled in the art will understand that, unless specifically stated otherwise, the singular forms "a," "an," "the," and "said" used herein also include plural forms. It should be further understood that the term "comprise" as used in the specification of the present disclosure means that there are the stated features, integers, steps, operations, elements, and/or assemblies, but that the presence or addition of one or more other features, integers, steps, operations, elements, assemblies, and/or groups thereof is not excluded. It should be understood that when an element is said to be "connected" or "coupled" to another element, it can be directly connected or coupled to the other element, or there may be intermediate elements. Furthermore, "connected" or "coupled" as used herein may include wireless connections or wireless couplings. The term "and/or" as used herein includes all or any element and all combinations of one or more of the associated listed items.

As shown in FIG. 1, in a traditional dynamic random access memory (DRAM), a memory cell consists of a transistor and a capacitor, i.e. a 1T1C memory cell. In FIG. 1, Gate represents the gate of the transistor, Source represents the source of the transistor, Drain represents the drain of the transistor, Storage Node (SN) represents the storage node, Capacitor represents the capacitance, Bit-line (abbreviated as BL) represents the bitline for reading and writing the memory cell (abbreviated as read/write cell), and Wordline (abbreviated as WL) represents the wordline for controlling the connection between the memory cell (abbreviated as cell) and BL. Vcc/2 represents the voltage received by one end of the capacitance.

However, the reading process of the memory with traditional 1T1C memory cells involves completely dissipating the charge stored in the capacitance onto the Bit-line (BL). Therefore, the reading process of the memory with traditional 1T1C memory cells is destructive.

Figure 2:
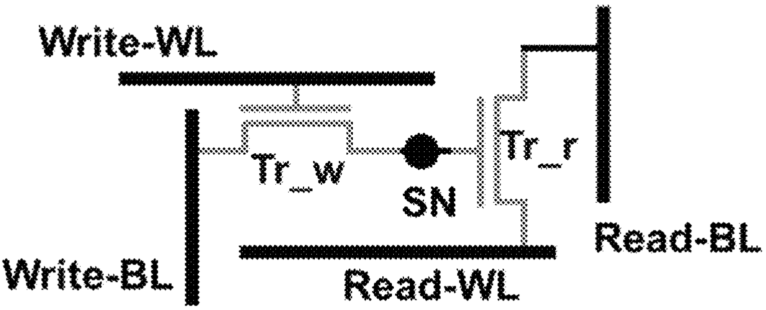
FIG. 2 is a structural schematic diagram of a 2T0C memory cell.

As shown in FIG. 2, the 2T0C memory cell of the present disclosure, compared to the traditional 1T1C memory cell, does not require a large capacitance at the storage node SN.

The 2T0C memory cell consists of two transistors, wherein the transistor Tr_w is configured for writing data, which is also referred to as the write transistor, and the other transistor Tr_r is configured for storing data. SN represents the storage node, Write_WL represents the wordline for writing data, Write_BL represents the bitline for writing data, Read_WL represents the wordline for reading data, and Read_BL represents the bitline for reading data.

Figure 3:
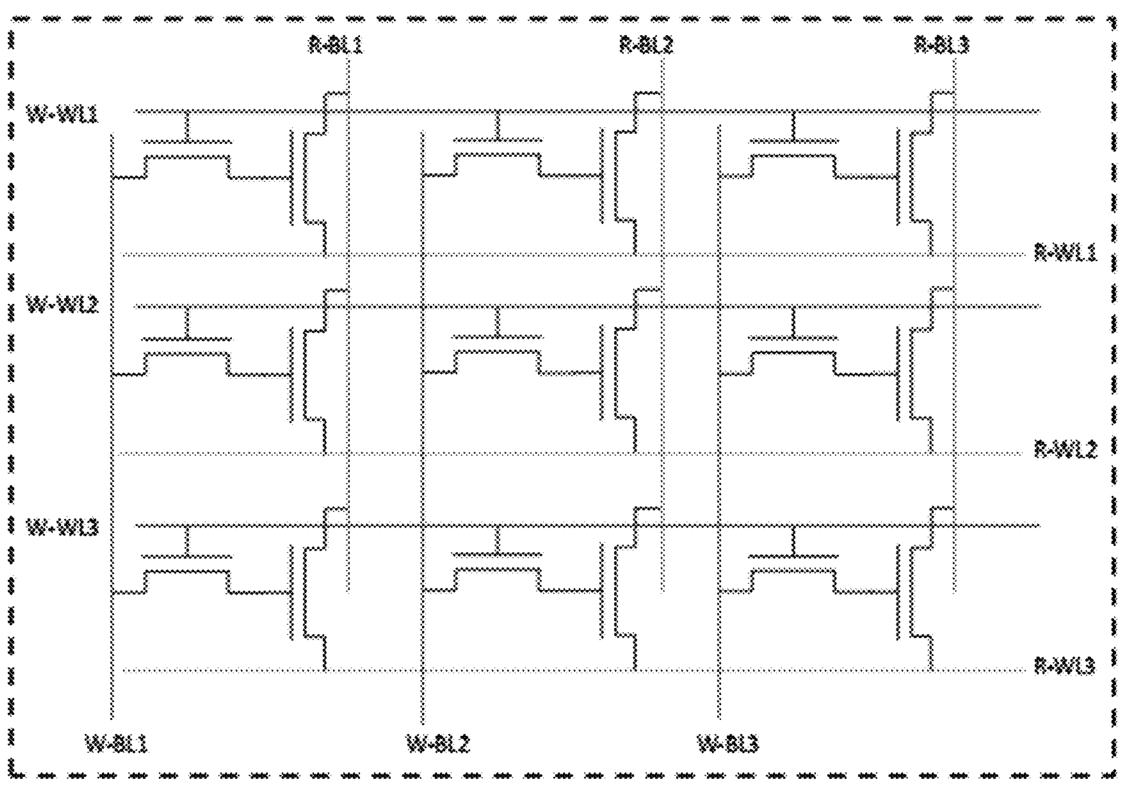
FIG. 3 is a structural schematic diagram of a 2T0C memory array.

FIG. 3 is a schematic diagram of an array of 2T0C memory cells. The W_WL1, W_WL2, and W_WL3 extending along the row direction represent the first wordline, the second wordline, and the third wordline for writing data during the data writing stage, respectively. The W_BL1, W_BL2, and W_BL3 extending along the column direction represent the first bitline, the second bitline, and the third bitline for writing data during the data writing stage, respectively. The R_WL1, R_WL2, and R_WL3 extending along the row direction represent the first wordline, the second wordline, and the third wordline for reading data during the data reading stage, respectively. The R_BL1, R_BL2, and R_BL3 extending along the column direction represent the first bitline, the second bitline, and the third bitline for reading data during the data reading stage, respectively.

Figure 4:
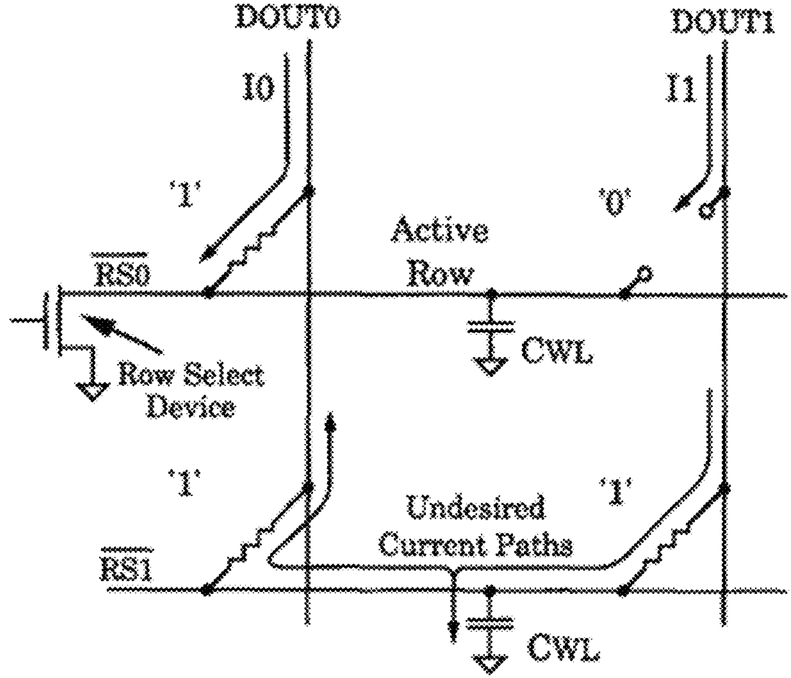
FIG. 4 is a schematic diagram illustrating a problem of crosstalk or current sharing in a 2T0C memory array.

As shown in FIG. 2 to FIG. 4, a method for accessing the memory with 2T0C memory cells currently involves utilizing the conductive property of the transistor Tr_r on the right side of the storage node SN. The storage node SN is connected to the gate of transistor Tr_r, thereby allowing the potential at SN to control on-off of the transistor Tr_r.

As shown in FIG. 2 and FIG. 4, in the case that the potential at the storage node SN is a high potential 1, the transistor Tr_r is on. In the case that the potential at SN is a low potential 0, the transistor Tr_r is off. In the case that the storage node of one of the memory cells stores a "0" (for example, the top-right memory cell in FIG. 4 stores a "0"), the transistor Tr_r of the memory cell is off. In the case that an adjacent memory cell stores a "1", the transistor Tr_r of the adjacent memory cell is on (and in this case, the transistor Tr_r is equivalent to a resistor).

To access the data (which is "0") stored in the top-right memory cell, the transistor Tr_r of the top-right memory cell should be off. However, as the adjacent memory cell stores a "1", the transistor Tr_r of the top-right memory cell is on through its adjacent memory cell, as indicated by the arrows in FIG. 4. This results in the transistor Tr_r of the top-right memory cell not being off. Consequently, this creates crosstalk or current sharing issues between the R-WLs and the R-BLs, which interferes with the access to the top-right memory cell.

The present disclosure provides a new memory and a new method for accessing a memory, and an electronic device. In the new memory, a control circuit is provided in the peripheral circuit. The control circuit, in conjunction with a driving method and cooperating with the memory array, can reliably read data while avoiding or effectively reducing crosstalk.

The technical solutions of the present disclosure and how the technical solutions of the present disclosure solve the technical problems described above are described in detail below by way of specific embodiments. These following specific embodiments may be combined with each other, and the same or similar concepts or processes may not be repeated in certain embodiments. The embodiments of the present disclosure will be described below in conjunction with the accompanying drawings.

The embodiments of the present disclosure provide a memory. The memory includes at least one memory array, which could extend to a plurality of memory arrays. A control circuit is provided at the periphery of each memory array. Adjacent memory arrays share all or part of a control circuit, or there are two sets of control circuits that operate independently.

The control circuit is shared by two memory arrays or is used exclusively by a single memory array.

In some embodiments, in the case that one control circuit controls one row or one column of memory cells, then for n rows or n columns of memory cells, there will be n control circuits. Each control circuit is connected only to one of the memory arrays, or it is also connected to one row or one column of memory cells in an adjacent memory array.

Alternatively, n rows or n columns of memory cells may be provided with 2n control circuits, with each control circuit connected to the odd or even memory cells in the one row or one column of the memory array. Similarly, each control circuit is either connected to one of the memory arrays or is shared with one row or one column of memory cells in an adjacent memory array.

An example where one control circuit drives one memory array is used below to illustrate the inventive concept of the present disclosure.

Provided is a memory, which includes one memory array and one control circuit.

The memory array further includes a plurality of read wordlines and a plurality of read bitlines for read operations.

The control circuit is connected to the read wordlines and the read bitlines of the memory array for read operations.

Taking 2T0C as an example, each memory cell includes a first transistor (also referred to as the write transistor) and a second transistor (also referred to as the read transistor). The gate of the second transistor is connected to the first electrode of the first transistor, the first electrode of the second transistor is connected to the read wordline, and the second electrode of the second transistor is connected to the read bitline.

The control circuit is connected to one read wordline and one read bitline in the memory array.

The control circuit is configured to transmit, during a pre-processing stage, a first voltage to the read wordline and the read bitline.

Additionally, during a pre-charging stage, the control circuit transmits a second voltage to the read bitline connected to the memory cell, and during the read-sensing stage, the control circuit transmits a third voltage to the read wordline connected to the memory cell.

The embodiments of the present disclosure provide a new memory that is designed based on the 2T0C memory cells by providing at least one control circuit to achieve normal data reading operations while improving crosstalk. Specifically, the physical structure of the memory, in conjunction with a driving method, involves transmitting a first voltage to a plurality of read wordlines and a plurality of read bitlines during the pre-processing stage to cut off the second transistor in each memory cell, which leads to all second transistors being cut off before entering the pre-charging stage and the read-sensing stage. Additionally, the two stages of pre-charging and reading enable reliable data reading while avoiding or effectively reducing crosstalk.

In some embodiments, the control circuit is further configured to stop, during the read-sensing stage, outputting the second voltage to the read bitline.

In some embodiments, the second transistor is an N-type or P-type transistor, and the first transistor is an N-type or P-type transistor.

In the case that the second transistor is an N-type transistor, the second voltage is greater than the first voltage, and the third voltage is less than the first voltage; or in the case that the second transistor is a P-type transistor, the second voltage is less than the first voltage, and the third voltage is greater than the first voltage.

The application scenarios for the first transistor and the second transistor can vary widely. For example, the first transistor and the second transistor are silicon transistors or metal oxide transistors, etc.

Figure 5:
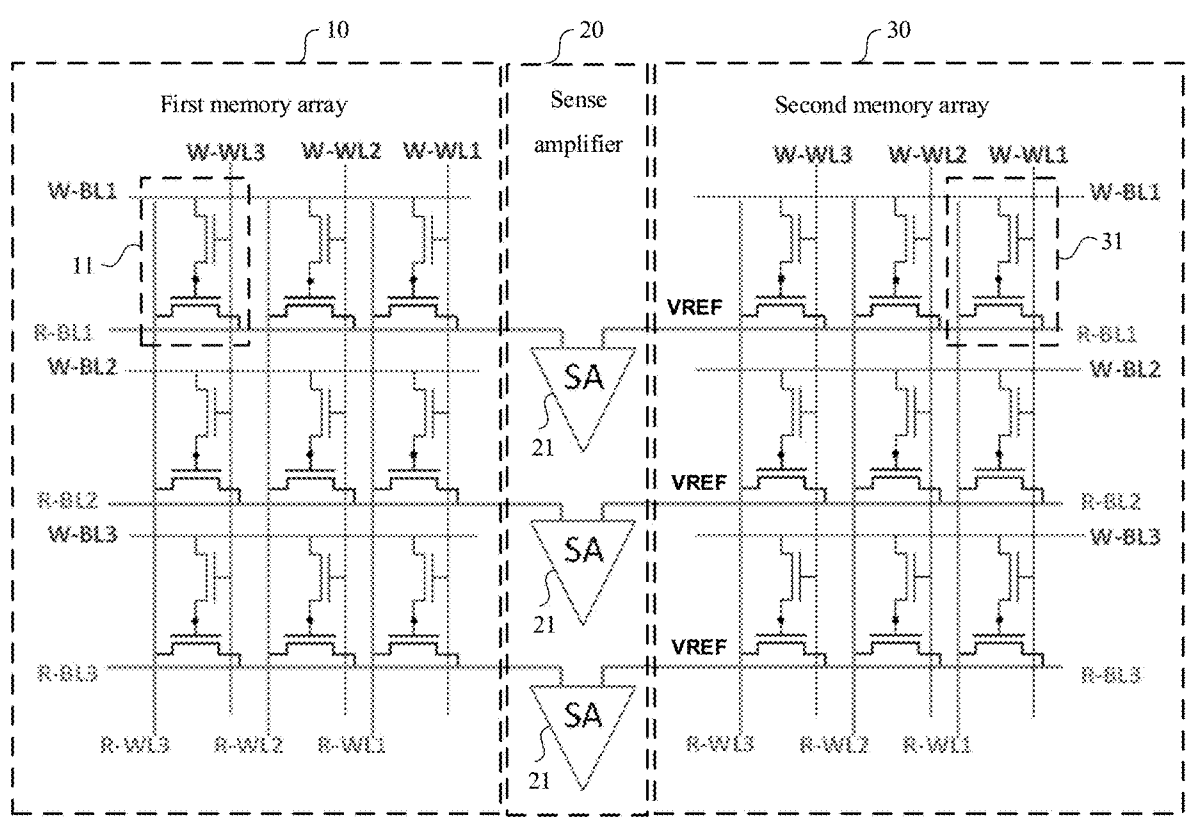
FIG. 5 is a structural schematic diagram of a memory according to some embodiments of the present disclosure.
Figure 6:
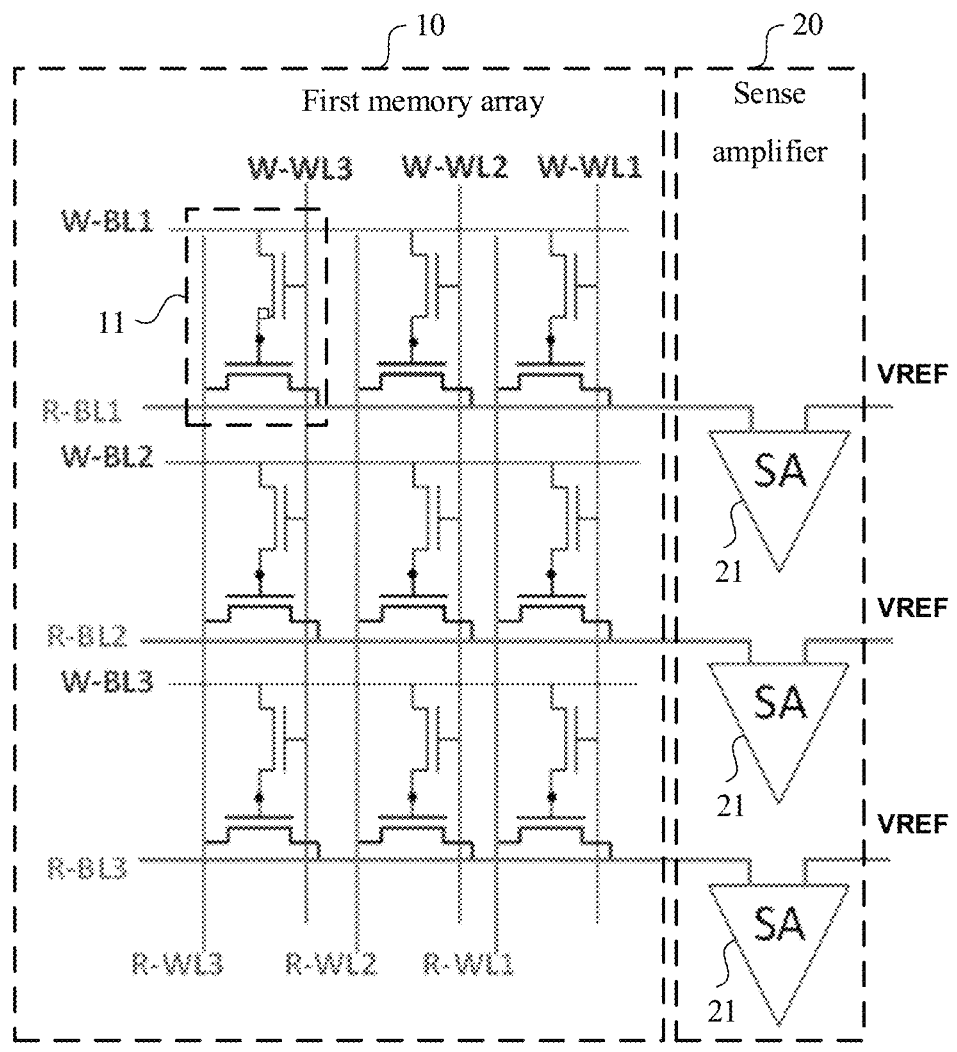
FIG. 6 is a structural schematic diagram of another memory according to some embodiments of the present disclosure.

As shown in FIG. 5 and FIG. 6, in the case that both the first transistor and the second transistor are N-type transistors, the first electrode of the first transistor is the source, and the second electrode of the first transistor is the drain, the first electrode of the second transistor is the source, and the second electrode of the second transistor is the drain. That is, the source of the first transistor is connected to the gate of the second transistor, the drain of the first transistor is connected to the write bitline, the gate of the first transistor is connected to the write wordline, the source of the second transistor is connected to the read wordline, and the drain of the second transistor is connected to the read bitline.

In the case that the first transistor is an N-type transistor and the second transistor is a P-type transistor, the first electrode of the first transistor is the source, and the second electrode of the first transistor is the drain, the first electrode of the second transistor is the drain, and the second electrode of the second transistor is the source. That is, the source of the first transistor is connected to the gate of the second transistor, the drain of the first transistor is connected to the write bitline, the gate of the first transistor is connected to the write wordline, the drain of the second transistor is connected to the read wordline, and the source of the second transistor is connected to the read bitline (not shown in the figure).

In some embodiments, at least one control circuit is configured to transmit, during the pre-processing stage, the first voltage to the plurality of read wordlines and the plurality of read bitlines to cut off the second transistor in each memory cell; transmit, during the pre-charging stage, the second voltage to the read bitlines connected to the memory cells to be accessed; and transmit, during the read-sensing stage, the third voltage to the read wordlines connected to the memory cells to be accessed and stop outputting the second voltage to the read bitlines connected to the memory cells to be accessed. Here, the second voltage is greater than the first voltage, and the third voltage is less than the first voltage; or, the second voltage is less than the first voltage, and the third voltage is greater than the first voltage.

In some embodiment, at least one control circuit is configured to transmit, during the pre-processing stage, the first voltage to the plurality of read wordlines and the plurality of read bitlines to cut off the second transistor in each memory cell; transmit, during the pre-charging stage, the second voltage to the read bitlines connected to all memory cells; and transmit, during the read-sensing stage, the third voltage to the read wordlines connected to the memory cells to be accessed and stop outputting the second voltage to the read bitlines connected to the memory cells to be accessed. Here, the second voltage is greater than the first voltage, and the third voltage is less than the first voltage; or, the second voltage is less than the first voltage, and the third voltage is greater than the first voltage.

In other words, during the pre-charging stage, the second voltage is transmitted either to the read bitlines connected to all memory cells or to the read bitlines connected to the memory cells to be accessed. Transmitting the second voltage to the read bitlines connected to all memory cells during the pre-charging stage better facilitates subsequent refresh operations.

As shown in FIG. 5 and FIG. 6, the first memory array 10 includes a plurality of first memory cells 11 arranged in an array, with each first memory cell 11 including two transistors. The second memory array 30 includes a plurality of second memory cells 31 arranged in an array, with each second memory cell 31 including two transistors. The two-transistor configuration forms the 2T0C memory. In FIG. 5 and FIG. 6, W-BL1, W-BL2, and W-BL3 represent write bitlines; W-WL1, W-WL2, and W-WL3 represent write wordlines; R-BL1, R-BL2, and R-BL3 represent read bitlines; R-WL1, R-WL2, and R-WL3 represent read wordlines; SA represents a sense amplifying unit; and VREF represents a reference voltage.

In some embodiments, as shown in FIG. 5, the memory further includes at least one sense amplifier 20 and a plurality of write bitlines W-BL and a plurality of write wordlines W-WL for write operations. The sense amplifier 20 includes at least one sense amplifying unit 21. The sense amplifying unit 21 is the sense amplifying unit 21 shown in FIG. 8 and FIG. 10, which includes transistors S1-S4. Alternatively, the sense amplifying unit 21 is the sense amplifying unit 21 shown in FIG. 12, which includes transistors S1-S6. Compared to the sense amplifying unit 21 shown in FIG. 8 and FIG. 10, the sense amplifying unit 21 shown in FIG. 12 has two more transistors, which, upon sensing a voltage difference between two input terminals, creates positive feedback among the transistors, thus providing better stability. In each memory cell, the gate of the first transistor is connected to the write wordline W-WL, and the second electrode of the first transistor is connected to the write bitline W-BL.

In some embodiments, as shown in FIG. 6, the sense amplifier 20 is correspondingly connected to one memory array (the first memory array). The first input terminal of each sense amplifying unit is connected to one read bitline R-BL, and the second input terminal of each sense amplifying unit is configured to receive a reference voltage VREF. The output terminal of each sense amplifying unit is connected to one write bitline (the connection of the output terminal of the sense amplifying unit is not shown in FIG. 6; for the connection of the output terminal of the sense amplifying unit, please refer to FIG. 8 and FIG. 10). During the pre-charging stage, the second voltage input to each read bitline (R-BL1, R-BL2, R-BL3, etc.) is greater than the reference voltage VREF.

In some embodiments, as shown in FIG. 5, the sense amplifier is correspondingly connected to two memory arrays (the first memory array 10 and the second memory array 30). The first input terminal of each sense amplifying unit 21 is connected to the read bitline R-BL in the first memory array, and the second input terminal of each sense amplifying unit is connected to the read bitline R-BL in the second memory array for receiving the reference voltage VREF through one of the read bitlines R-BL. For example, the read bitlines in the second memory array in FIG. 5 are configured to provide the reference voltage VREF. The first output terminal of each sense amplifying unit 21 is connected to one write bitline, and the second output terminal of each sense amplifying unit 21 is connected to another write bitline. During the pre-charging stage, the second voltage input to each read bitline (R-BL1, R-BL2, R-BL3, etc.) is greater than the reference voltage VREF.

In the case that the second transistor is an N-type transistor, the second voltage is greater than the reference voltage, and the third voltage is less than the reference voltage. In the case that the second transistor is a P-type transistor, the second voltage is less than the reference voltage, and the third voltage is greater than the reference voltage.

It should be noted that when the first memory array 10 is being read, the second memory array provides the reference voltage for the first memory array 10. Similarly, when the second memory array 30 is being read, the first memory array 10 provides the reference voltage for the second memory array 30.

As shown in FIG. 5 and FIG. 6, in some embodiments of the present disclosure, the reference voltage received by the sense amplifier 20 is provided by the second memory array 30. Alternatively, the sense amplifier 20 receives a reference voltage directly from an external source.

In the case that the reference voltage received by the sense amplifier 20 is provided by the memory array, that is, one sense amplifier 20 is connected simultaneously to two memory arrays, one of the memory arrays is used for data storage, and the other memory array is used for providing the reference voltage. Compared with the traditional configuration where one sense amplifier 20 is connected to one memory array, the configuration herein can save one sense amplifier 20.

Figure 7:
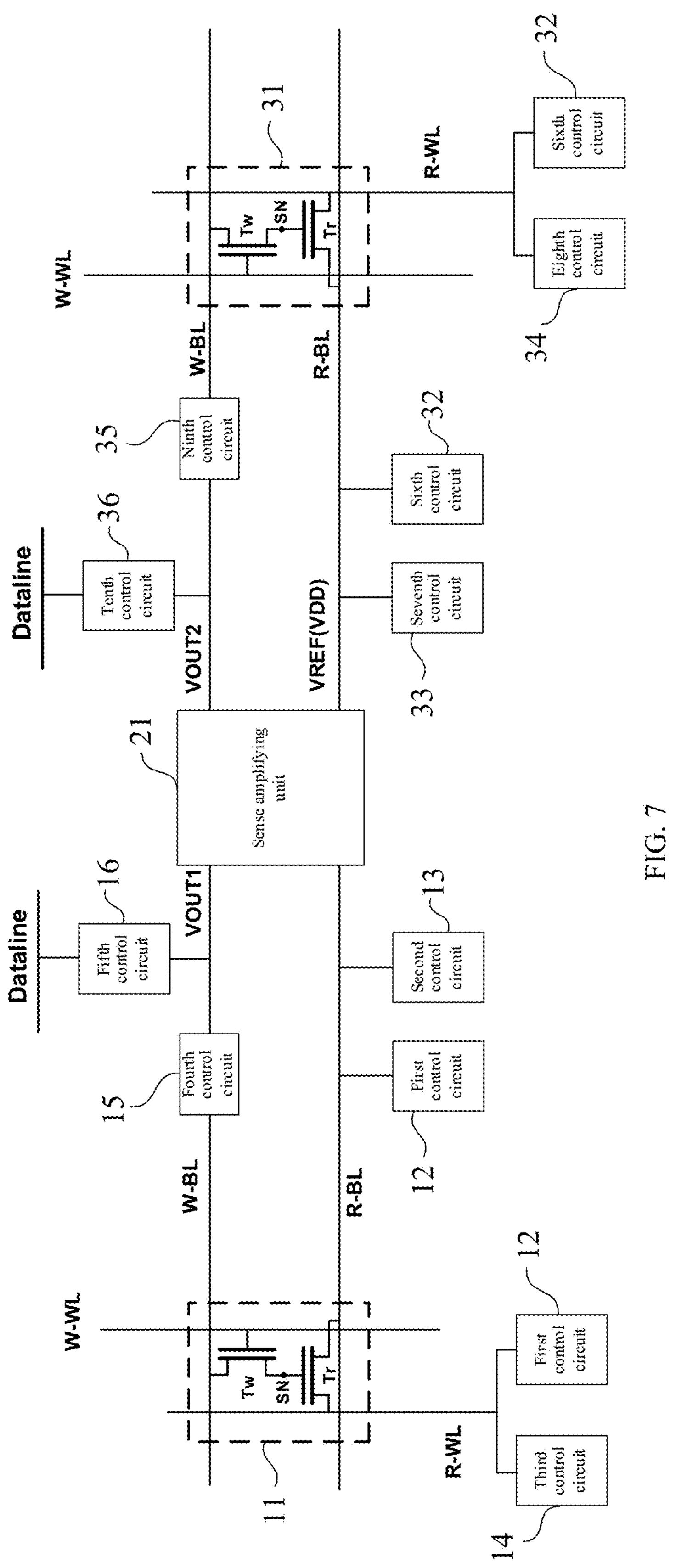
FIG. 7 is a structural schematic diagram illustrating accessing to one memory cell in FIG. 5 according to some embodiments of the present disclosure.

As shown in FIG. 7, both the first memory cell 11 and the second memory cell 31 include a first transistor Tw and a second transistor Tr. The gate of the second transistor Tr is connected to the first electrode of the first transistor Tw (i.e., connected to the storage node SN), the first electrode of the second transistor Tr is connected to the read wordline R-WL, and the second electrode of the second transistor Tr is connected to the read bitline R-BL.

Figure 8:
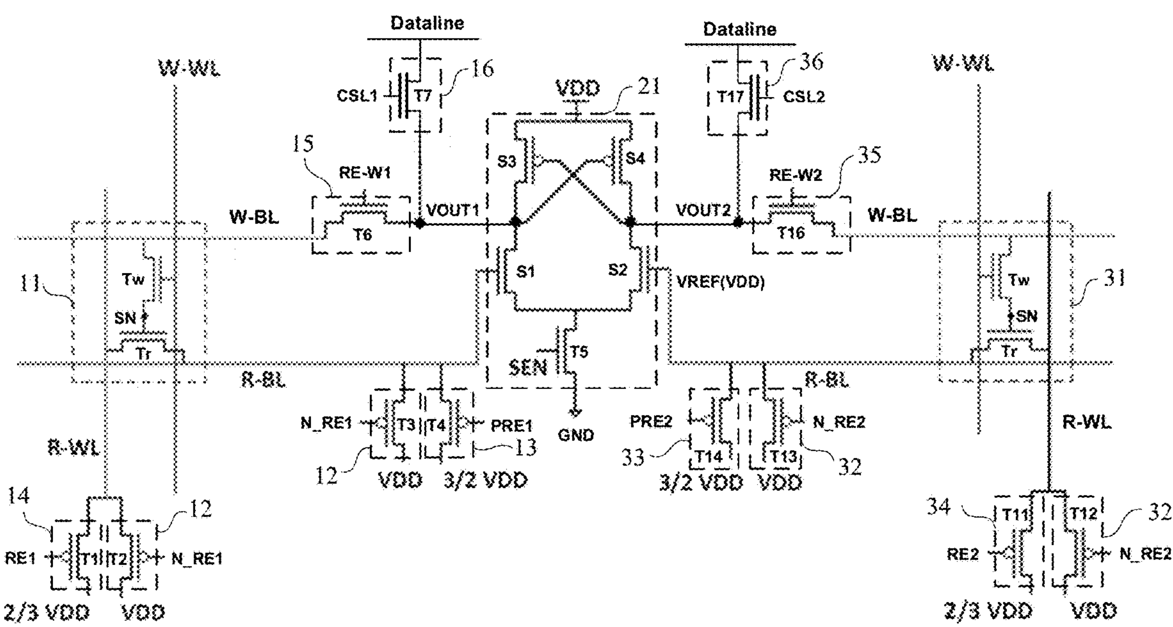
FIG. 8 is a circuit schematic diagram illustrating accessing to one memory cell in FIG. 5 according to some embodiments of the present disclosure.
Figure 9:
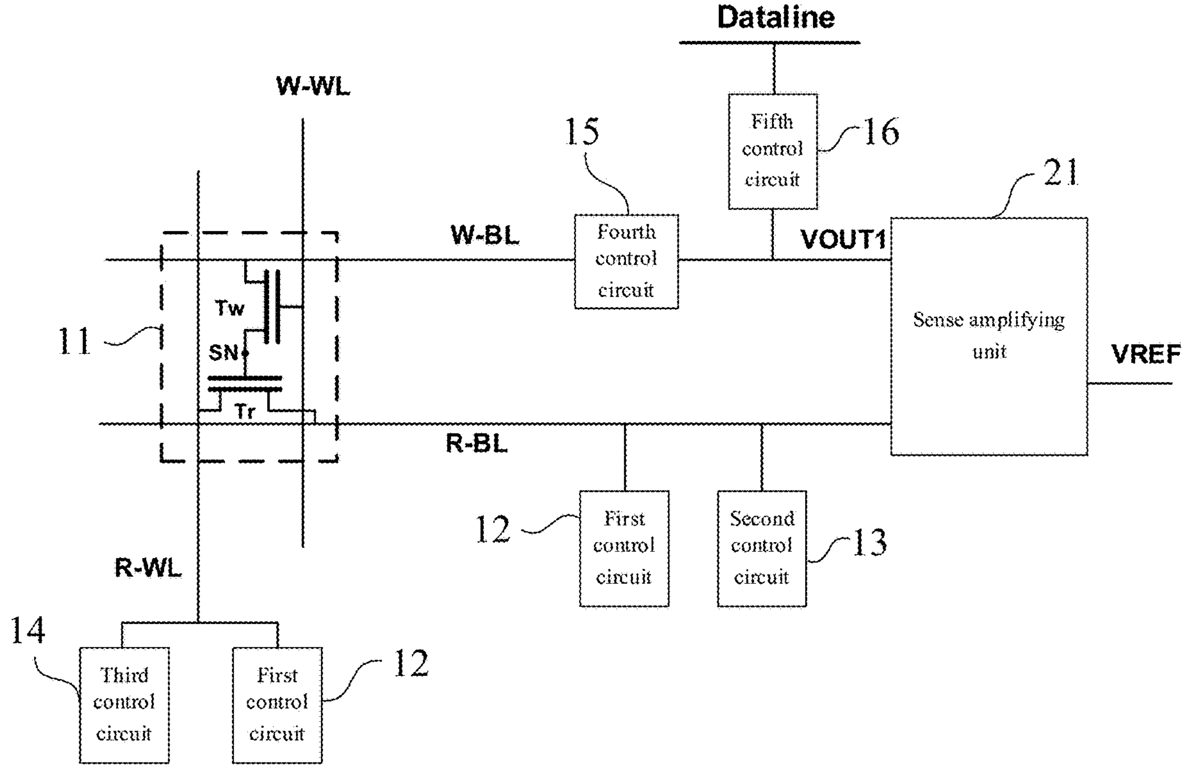
FIG. 9 is a structural schematic diagram illustrating accessing to one memory cell in FIG. 6 according to some embodiments of the present disclosure.

In some embodiments, as shown in FIG. 7, FIG. 8, and FIG. 9, the control circuit includes a first control circuit 12.

Each first control circuit 12 is connected to one read bitline R-BL and one read wordline R-WL.

The first control circuit 12 is configured to transmit, during the pre-processing stage, a first voltage VDD to a plurality of read wordlines R-WL and a plurality of read bitlines R-BL based on a first control signal N-RE1 to cut off the second transistor Tr in each memory cell, thereby preventing crosstalk or current sharing issues between the read wordline R-WL and read bitline R-BL, and then reducing interference with access to the memory array.

Figure 10:
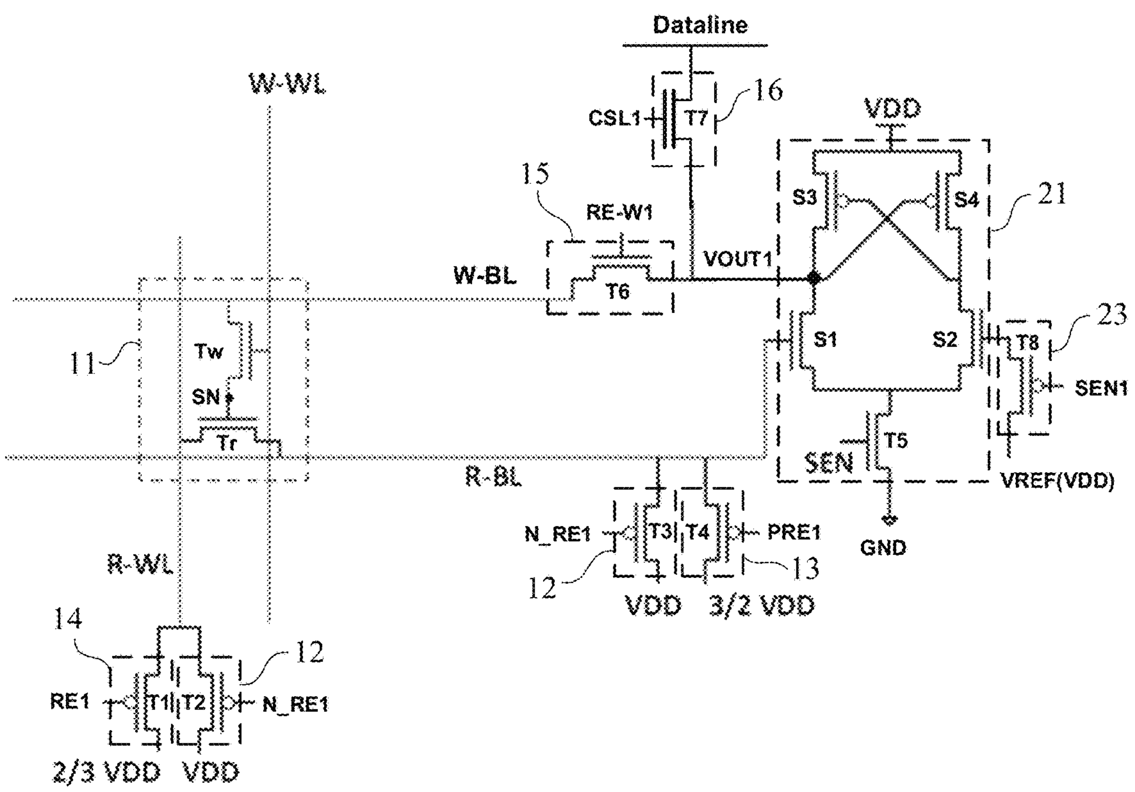
FIG. 10 is a circuit schematic diagram illustrating accessing to one memory cell in FIG. 6 according to some embodiments of the present disclosure.

In some embodiments, as shown in FIG. 8 and FIG. 10, the first control circuit 12 includes a transistor T2 and a transistor T3. The control electrode of the transistor T2 and the control electrode of the transistor T3 both receive the first control signal N-RE1. The first electrode of the transistor T2 is connected to the read wordline R-WL, and the second electrode of the transistor T2 receives the first voltage VDD. The first electrode of the transistor T3 is connected to the read bitline R-BL, and the second electrode of the transistor T3 receives the first voltage VDD. For the timing of the first control signal N-RE1, please refer to FIG. 11.

In some embodiments, as shown in FIG. 7, FIG. 8, FIG. 9, and FIG. 10, the control circuit includes a second control circuit 13.

Each second control circuit 13 is connected to one read bitline R-BL.

The second control circuit 13 is configured to transmit, during the pre-charging stage, the second voltage to the read bitlines R-BL connected to all memory cells or to the read bitlines R-BL connected to the memory cells to be accessed based on a second control signal PRE1; and stop, during the read-sensing stage, outputting the second voltage to the read bitlines R-BL connected to the memory cells to be accessed. Specifically, the second voltage is greater than the first voltage; in the case that the first voltage is VDD, the second voltage is 3/2 VDD.

In some embodiments, as shown in FIG. 8 and FIG. 10, the second control circuit 13 includes a transistor T4. The control electrode of the transistor T4 receives the second control signal PRE1, the first electrode of the transistor T4 is connected to the read bitline R-BL, and the second electrode of the transistor T4 receives the second voltage of 3/2 VDD. For the timing of the second control signal PRE1, please refer to FIG. 11.

In some embodiments, as shown in FIG. 7, FIG. 8, FIG. 9, and FIG. 10, the control circuit includes a third control circuit 14.

Each third control circuit 14 is connected to one read wordline R-WL.

The third control circuit 14 is configured to transmit, during the read-sensing stage, the third voltage to the read wordlines R-WL connected to the memory cells to be accessed based on a third control signal RE1. Specifically, the third voltage is less than the first voltage; in the case that the first voltage is VDD, the third voltage is 2/3 VDD.

In some embodiments, as shown in FIG. 8 and FIG. 10, the third control circuit 14 includes a transistor T1. The control electrode of the transistor T1 receives the third control signal RE1, the first electrode of the transistor T1 is connected to the read wordline R-WL, and the second electrode of the transistor T1 receives the third voltage of 2/3 VDD. For the timing of the third control signal PRE1, please refer to FIG. 11.

It should be noted that the control circuits in the present disclosure are provided as examples. Other types of control circuit that can achieve the same control functions are also applicable. The specific type of control circuits is not limited in the present disclosure.

In some embodiments, as shown in FIG. 7 and FIG. 9, the memory further includes a fourth control circuit 15 and a fifth control circuit 16.

As shown in FIG. 8 and FIG. 10, the fourth control circuit 15 is connected to the output terminal of the sense amplifying unit 21 and the write bitline W-BL. The fourth control circuit 15 is configured to write the read data back into the corresponding memory cell based on the fourth control signal RE-W1. In some embodiments, the fourth control circuit 15 includes a transistor T6. The control electrode of the transistor T6 receives the fourth control signal RE-W1, the first electrode of the transistor T6 is connected to the output terminal VOUT1 of the sense amplifying unit 21, and the second electrode is connected to the write bitline W-BL. Specifically, the timing of the fourth control signal RE-W1 is at a high level during the read-sensing stage and at a low level during other stages.

As shown in FIG. 8 and FIG. 10, the fifth control circuit 16 is connected to the output terminal of the sense amplifying unit 21. The fifth control circuit 16 is configured to transmit data output from the sense amplifying unit to the data line Dataline based on the selection signal CSL1, thereby outputting the read data. In some embodiments, the fifth control circuit 16 includes a transistor T7. The control electrode of the transistor T7 receives the selection signal CSL1, the first electrode of the transistor T7 is connected to the output terminal VOUT1 of the sense amplifying unit 21, and the second electrode of the transistor T7 is connected to the data line Dataline. In the case that the transistor T7 is an N-type transistor, and the selection signal CSL1 is at a high level, the read data is output to the data line Dataline; in the case that the selection signal CSL1 is at a low level, the read data is not output to the data line Dataline. In the case that the transistor T7 is a P-type transistor, and the selection signal CSL1 is at a low level, the read data is output to the data line Dataline; in the case that the selection signal CSL1 is at a high level, the read data is not output to the data line Dataline.

As shown in FIG. 8 and FIG. 10, the sense amplifying unit 21 includes a switch circuit. The switch circuit is configured to activate, based on the sense control signal SEN, the sense amplifying unit 21, allowing the sense amplifying unit 21 to sense and amplify the read data before outputting it. In some embodiments, the switch circuit includes a transistor T5. The control electrode of the transistor T5 receives the sense control signal SEN, the first electrode of the transistor T5 is connected to the sense amplifying circuit, and the second electrode of the transistor T5 is connected to the ground terminal GND. For the timing of the sense control signal SEN, please refer to FIG. 11.

In some embodiments, as shown in FIG. 7, the memory further includes a sixth control circuit 32, a seventh control circuit 33, an eighth control circuit 34, a ninth control circuit 35, and a tenth control circuit 36. The sixth control circuit 32, the seventh control circuit 33, the eighth control circuit 34, the ninth control circuit 35, and the tenth control circuit 36 correspond to the second memory array 30.

In one example, in the case that the second memory array provides a reference voltage VREF to the sense amplifying unit, and the reference voltage VREF is VDD, the voltage VDD is transmitted to the read bitline R-BL by setting, when the sense amplifying unit is activated, the control signal N-RE2 low to turn on the transistor T13. The voltage VDD is then transmitted to the input terminal of the sense amplifying unit 21, thereby providing the sense amplifying unit 21 with the reference voltage VREF, which is VDD, as indicated by VREF (VDD) in FIG. 7.

In some embodiments, as shown in FIG. 10, the memory further includes a reference voltage control circuit 23. The reference voltage control circuit 23 is connected to the sense amplifying unit 21 for transmitting the reference voltage VREF to the sense amplifying unit 21 based on the reference voltage control signal SEN1. The reference voltage VREF may also be externally provided, rather than being supplied by the memory array as shown in FIG. 7 and FIG. 8. In some embodiments, the reference voltage control circuit 23 includes a transistor T8. The control electrode of the transistor T8 receives the reference voltage control signal SEN1, the first electrode of the transistor T8 is connected to the input terminal of the sense amplifying unit 21, and the second electrode of the transistor T8 receives the reference voltage VREF. The reference voltage VREF is VDD, i.e. the VREF (VDD) shown in FIG. 10.

In some embodiments, for the transistors mentioned above, the first electrode is the source, and the second electrode is the drain. Alternatively, for the transistors mentioned above, the first electrode is the drain, and the second electrode is the source. The functionality of the electrodes is interchangeable according to the type of transistor and different input signals, which are not specifically distinguished in the present disclosure.

In some embodiments, all the transistors mentioned above are either N-type or P-type transistors. It should be understood by those skilled in the art that the circuit connection modes shown in FIG. 8 and FIG. 10 are only illustrated as examples of the memory provided by the embodiments of the present disclosure and are not intended to be limiting.

In a specific example, just for illustration, the example where the second transistor in the memory cell is an N-type transistor is used to explain the working principle of memory. For example, the first voltage is set to VDD, the second voltage is set to 3/2 VDD, the third voltage is set to 2/3 VDD, and the reference voltage VREF is set to VDD.

Figures 11, 12:
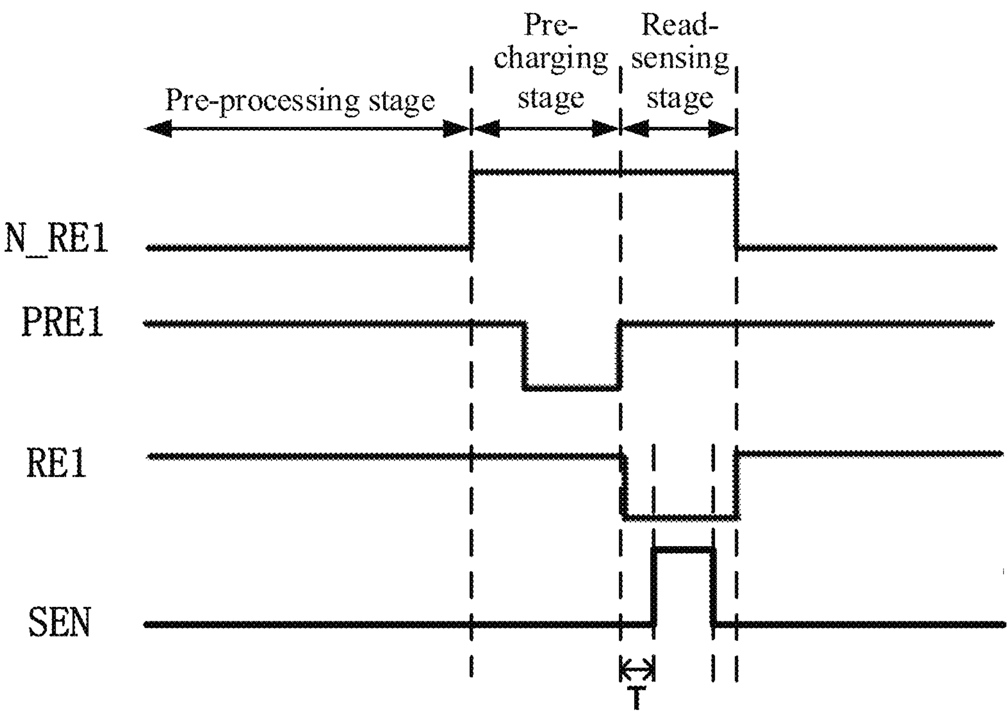
FIG. 11 is a timing schematic diagram of a method for accessing a memory according to some embodiments of the present disclosure.
FIG. 12 is a structural schematic diagram of another sense amplifying unit according to some embodiments of the present disclosure.

Combining what is shown in FIG. 10 and FIG. 11, the working principle of memory access is as follows:

As shown in FIG. 10, transistors T1, T2, T3, T4, and T8 are all P-type transistors, and transistors T5, T6, and T7 are all N-type transistors.

1. During the pre-processing stage, the first control signal N-RE1 is at a low level, the transistor T2 and the transistor T3 are turned on, and the first voltage VDD is transmitted to the read wordline R-WL and the read bitline R-BL. In the case that the data stored at the storage node SN is "1", the gate-source voltage Vgs of the second transistor Tr is 0. As the threshold voltage Vth of the second transistor Tr is greater than zero and Vgs<Vth, the second transistor Tr in the first memory cell 11 is cut off. In the case that the data stored at the storage node SN is "0", the gate-source voltage Vgs of the second transistor Tr is less than 0, and Vgs<Vth, the second transistor Tr in the first memory cell 11 is cut off. That is, regardless of whether the data stored in the first memory cell 11 is "1" or "0", the second transistor Tr in the first memory cell 11 is cut off. As the second transistor Tr in the first memory cell 11 is cut off, interference with subsequent read operations is avoided.

2. During the pre-charging stage, the second control signal PRE1 is at a low level, the transistor T4 is turned on, and the second voltage of 3/2 VDD is transmitted to the read bitline R-BL for pre-charging the read bitline R-BL. During the stage, as the second transistor Tr is cut off, the voltage on the read bitline R-BL after pre-charging remains at the second voltage of 3/2 VDD.

3. During the reading stage, the third control signal RE1 is at a low level, the transistor T1 is turned on, and the third voltage of 2/3 VDD is transmitted to the read wordline R-WL. At the same time, as the second control signal PRE1 during the stage is at a high level, the transistor T4 is cut off. In the case that the data stored at the storage node SN is "1", the second transistor Tr is turned on, causing the voltage on the read bitline R-BL to change, which means that the voltage on the read bitline R-BL discharges towards the read wordline R-WL. In the case that the data stored at the storage node SN is "0", the second transistor Tr cannot be turned on, leaving the read bitline R-BL in a floating state with no change in the voltage thereon. This process is used to read the data stored in the first memory cell 11.

4. During the sensing stage, after a preset time interval T following the output of the third voltage of 2/3 VDD, the sense control signal SEN is set at a high level, and the sense amplifying unit 21 is activated. The sense amplifying unit 21 outputs the data stored in the first memory cell 11 according to the comparison result between the voltage on the read bitline R-BL and the reference voltage. Based on the selection signal CSL1, the data output from the sense amplifying unit 21 is selectively transmitted to the data line Dataline, that is, selectively reading the data, thereby completing the entire data reading process.

Specifically, in the case that the data stored in the first memory cell 11 is "1", the second transistor Tr is turned on, and the current on the read bitline R-BL flows from the drain to the source of the second transistor Tr and onto the read wordline R-WL. In this case, the voltage on the read bitline R-BL is less than VDD. With the reference voltage of the sense amplifying unit 21 being VDD, the transistor S2 and the transistor S3 of the sense amplifying unit 21 are turned on, and the output terminal VOUT1 of the sense amplifying unit 21 outputs a high-level signal VDD, that is, it is sensed that the data stored in the first memory cell 11 is "1".

In the case that the data stored in the first memory cell 11 is "0," the second transistor Tris cut off, and there is no current on the read bitline R-BL. In this case, the voltage on the read bitline R-BL is in a floating state, remaining at the second voltage of 3/2 VDD. The transistor S3 of the sense amplifying unit 21 is in a cutoff state, causing the output terminal VOUT1 to output a low-level signal GND, that is, it is sensed that the data stored in the first memory cell 11 is "0".

In the embodiments, setting the sense control signal SEN to a high level after a preset time interval T following the output of the third voltage of 2/3 VDD and activating the sense amplifying unit 21 enables the voltage on the read bitline R-BL to be controlled between 2/3 VDD and 3/2 VDD in the case that the data stored in the first memory cell 11 is "1". This allows for more accurate data reading.

Combining what is shown in FIG. 10, the memory further includes a refresh process following the sensing stage:

5. During the write-back stage, the fourth control signal RE-W1 is at a high level, and the transistor T6 is turned on, allowing the data read from the output terminal VOUT1 of the sense amplifying unit 21 to be written back into the corresponding first memory cell 11.

Combined with FIG. 10, the memory further includes a new data writing stage following the sensing stage:

6. During the data writing stage, the write wordline W-WL is set to a high level, the first transistor Tw in the first memory cell 11 is turned on, and the new data is written into the first electrode of the first transistor Tw via the write bitline W-BL and stored at the storage node SN.

It should be noted that using an N-type transistor as the second transistor is only an optional solution of the present embodiments and does not limit the technical solutions of the present disclosure. In the case that the second transistor is changed to a P-type transistor, the working principle thereof would be similar to that of an N-type transistor, which will not be repeated herein.

Based on the same inventive concept, the embodiments of the present disclosure provide an electronic device that includes the memory as provided in any one of the aforementioned embodiments.

The electronic device provided by the embodiments of the present disclosure shares the same inventive concept and beneficial effects as the previous embodiments. Details not shown about the electronic device may refer to the previous embodiments and will not be repeated herein.

Figure 13:
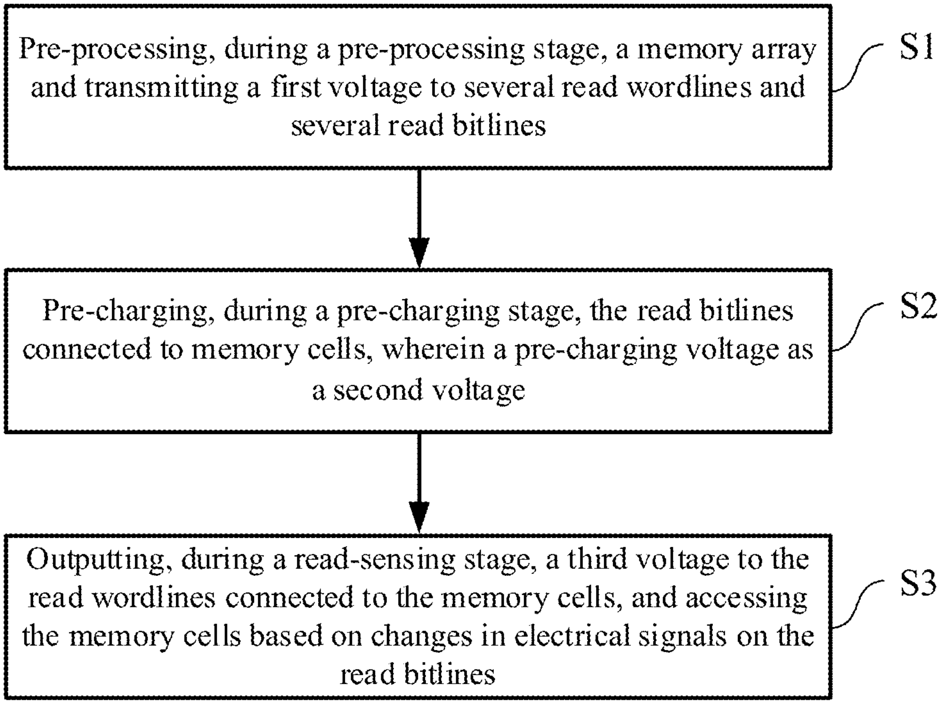
FIG. 13 is a schematic flowchart of a method for accessing a memory according to some embodiments of the present disclosure.

Based on the same inventive concept, as shown in FIG. 13, the embodiments of the present disclosure provide a method for accessing a memory, the method includes:

In S1, a pre-processing stage, a memory array is pre-processed, and a first voltage is transmitted to a plurality of read wordlines and a plurality of read bitlines.

In S2, a pre-charging stage, the read bitlines connected to memory cells are pre-charged wherein a pre-charging voltage is a second voltage.

In S3, a read-sensing stage, a third voltage is outputted to the read wordlines connected to the memory cells, and the memory cells are accessed based on changes in electrical signals on the read bitlines.

The embodiments of the present disclosure provide a new method for accessing a memory. During the pre-processing stage, the first voltage is transmitted to the read wordlines and read bitlines to cut off the second transistor in each memory cell, such that all the second transistors are cut off before entering the pre-charging stage and the read-sensing stage, and that, by the pre-charging and the read-sensing, the data can be reliably read out while crosstalk can be avoided or effectively reduced.

In some embodiments, the method for accessing the memory further includes: stopping, during the read-sensing stage, outputting the second voltage to the read bitlines.

In some embodiments, in the case that the second transistor is an N-type transistor, the second voltage is greater than the first voltage, and the third voltage is less than the first voltage; or in the case that the second transistor is a P-type transistor, the second voltage is less than the first voltage, and the third voltage is greater than the first voltage.

In some embodiments, the read bitlines connected to all memory cells are pre-charged during the pre-charging stage, wherein a pre-charging voltage is the second voltage, and the second voltage is greater than the first voltage.

During the pre-charging stage, the read bitlines connected to all memory cells are pre-charged, or only the read bitlines connected to the memory cells to be accessed are pre-charged, which is not limited in the present disclosure.

In some embodiments, during the read-sensing stage, the method includes:

controlling, after a preset time interval following the output of the third voltage, a sense amplifying unit to be activated to compare a voltage on the read bitlines connected to the memory cells to be accessed with a reference voltage, and outputting data stored in the memory cells based on the comparison result.

As shown in FIG. 9, in the embodiments of the present disclosure, activating the sense amplifying unit after a preset time interval T following the output of the third voltage to compare the voltage on the read bitlines connected to the memory cells to be accessed with the reference voltage enables the voltage on the read bitline R-BL to be controlled between the third voltage (for example, 2/3 VDD) and the second voltage (for example, 3/2 VDD) in the case that the data stored in the memory cell is "1". This allows more accurate data reading.

In some embodiments, comparing the voltage on the read bitlines connected to the memory cells to be accessed with the reference voltage and outputting the data stored in the memory cells based on the comparison result, includes:

outputting, in the case that the voltage on the read bitlines connected to the memory cells to be accessed is less than the reference voltage, a high-level signal, and transmitting, based on a selection signal, the high-level signal to a data line; or outputting, in the case that the voltage on the read bitlines connected to the memory cells to be accessed is greater than the reference voltage, a low-level signal is output, and transmitting, based on a selection signal, the low-level signal to a data line.

Specifically, as shown in FIG. 8, in the case that the data stored in the first memory cell 11 is "1", the second transistor Tr is turned on, and the current on the read bitline R-BL flows from the drain to the source of the second transistor Tr and onto the read wordline R-WL. In this case, the voltage on the read bitline R-BL is less than VDD. With the reference voltage of the sense amplifying unit 21 being VDD, the transistor S2 and the transistor S3 of the sense amplifying unit 21 are turned on, and the output terminal VOUT1 of the sense amplifying unit 21 outputs a high-level signal VDD, that is, it is sensed that the data stored in the first memory cell 11 is "1". Based on the selection signal CSL1, the data "1" output from the sense amplifying unit 21 is selectively transmitted to the data line Dataline, that is, selectively reading the data, thereby completing the entire data reading process.

In the case that the data stored in the first memory cell 11 is "0," the second transistor Tris cut off, and there is no current on the read bitline R-BL. In this case, the voltage on the read bitline R-BL is in a floating state, remaining at the second voltage of 3/2 VDD. The output terminal VOUT1 of the sense amplifying unit 21 outputs a low-level signal GND, that is, it is sensed that the data stored in the first memory cell 11 is "0". Based on the selection signal CSL1, the data "0" output from the sense amplifying unit 21 is selectively transmitted to the data line Dataline, that is, selectively reading the data, thereby completing the entire data reading process.

In some embodiments, after outputting the high-level signal, the method further includes:

controlling a first transistor in the memory cell to be accessed to be conducted, and writing the high-level signal back into a first electrode of the first transistor via a write bitline.

After outputting the low-level signal, the method further includes:

controlling the first transistor in the memory cell to be accessed to be conducted, and writing the low-level signal back into the first electrode of the first transistor via the write bitline.

Combined with FIG. 8, the memory further includes a refresh process following the sensing stage, which involves setting the fourth control signal RE-W1 to a high level, turning on the transistor T6, and writing the data read from the output terminal VOUT1 of the sense amplifying unit 21 back into the corresponding first memory cell 11.

In some embodiments, after outputting the high-level signal, the method further includes:

controlling a first transistor in the memory cell to be accessed to be conducted, and writing new data into a first electrode of the first transistor via a write bitline.

After outputting the low-level signal, the method further includes:

controlling the first transistor in the memory cell to be accessed to be conducted, and writing the new data into the first electrode of the first transistor via the write bitline.

Combined with FIG. 8, the memory further includes a new data writing stage following the sensing stage, which involves setting the write wordline W-WL to a high level, turning on the first transistor Tw in the first memory cell 11, and writing the new data into the first electrode of the first transistor Tw via the write bitline W-BL, thereby storing the new data at the storage node SN.

The present disclosure achieves at least the following beneficial effects:

The embodiments of the present disclosure provide a new memory and access method, by providing at least one control circuit that transmits the first voltage to the read wordlines and the read bitlines during the pre-processing phase to cause the second transistors in each memory cell to all be cut off, such that all the second transistors are cut off before entering the pre-charging stage and the read-sensing stage, and that, by the pre-charging and the read-sensing, the data can be reliably read out while crosstalk can be avoided or effectively reduced.

Those skilled in the art will understand that the steps, measures, and solutions in the various operations, methods, and processes discussed in the present disclosure can be alternated, changed, combined, or removed. Further, other steps, measures, and solutions in the various operations, methods, and processes discussed in the present disclosure can also be alternated, changed, rearranged, split, combined, or removed. Further, steps, measures, and solutions in various operations, methods, and processes existing in the prior art and of the present disclosure may also be alternated, changed, rearranged, split, combined, or removed.

The terms "first", "second" etc., are merely used for descriptive purposes and are not to be construed as indicating or implying the relative importance or as implicitly designating the quantity of the indicated technical features. Thus, features defined as "first", "second" etc., explicitly or implicitly include one or more of the features. In the descriptions of the present disclosure, "a plurality" means two or more, unless otherwise specified.

It should be understood that although the various steps in the flowcharts of the accompanying drawings are shown in order as indicated by the arrows, the steps are not necessarily performed in order as indicated by the arrows. Unless explicitly stated herein, there is no strict order requirement for the performance of the steps; they may be performed in different sequences. Moreover, at least some of the steps in the flowcharts of the accompanying drawings may include multiple sub-steps or stages, which do not necessarily need to be completed simultaneously but can be performed at different times. The order of performing the steps or stages is not necessarily sequential; they can be performed alternately or in rotation with other steps, the sub-steps of the other steps, or at least a part of the stages.

The descriptions above represent only a part of the embodiments of the present disclosure. It should be noted that those skilled in the art can make improvements and refinements without departing from the principles of the present disclosure, and these improvements and refinements should also be considered protected by the present disclosure.

The invention claimed is:

1. A memory, comprising:

at least one memory array;

at least one control circuit;

at least one sense amplifier, wherein the at least one sense amplifier comprises at least one sense amplifying unit;

at least one write bitline for write operations; and at least one write wordline for write operations, wherein the at least one memory array comprises a plurality of memory cells arranged in an array as well as a plurality of read wordlines and a plurality of read bitlines for read operations, wherein each of the memory cells comprises a first transistor and a second transistor, with a gate of the second transistor connected to a first electrode of the first transistor, a first electrode of the second transistor connected to a read wordline, and a second electrode of the second transistor connected to a read bitline, wherein the at least one control circuit is connected to the read wordline and the read bitline, and the at least one control circuit is configured to:

transmit, during a pre-processing stage, a first voltage to the read wordline and the read bitline;

transmit, during a pre-charging stage, a second voltage to the read bitline; and transmit, during a read-sensing stage, a third voltage to the read wordline; and, wherein the at least one sense amplifier is correspondingly connected to one memory array, wherein a first input terminal of each sense amplifying unit is connected to the read bitline, wherein a second input terminal of each sense amplifying unit is configured to receive a reference voltage, and wherein an output terminal of the sense amplifying unit is connected to the write bitline; or, wherein the at least one sense amplifier is correspondingly connected to two memory arrays, wherein a first input terminal of the at least one sense amplifying unit is connected to one read bitline, wherein a second input terminal of the at least one sense amplifying unit is connected to another read bitline for receiving the reference voltage via the another read bitline, and wherein a first output terminal of the at least one sense amplifying unit is connected to one write bitline, and a second output terminal of the at least one sense amplifying unit is connected to another write bitline.

2. The memory according to claim 1, wherein the at least one control circuit is further configured to:

stop, during the read-sensing stage, outputting the second voltage to the read bitline.

3. The memory according to claim 1, wherein:

the at least one control circuit is configured to:

transmit, during the pre-processing stage, the first voltage to the plurality of read wordlines and the plurality of read bitlines to cut off the second transistor in each of the memory cells;

transmit, during the pre-charging stage, the second voltage to the read bitlines connected to memory cells to be accessed; and transmit, during the read-sensing stage, the third voltage to the read wordlines connected to the memory cells to be accessed and stop outputting the second voltage to the read bitlines connected to the memory cells to be accessed; or the at least one control circuit is configured to:

transmit, during the pre-processing stage, the first voltage to the plurality of read wordlines and the plurality of read bitlines to cut off the second transistor in each of the memory cells;

transmit, during the pre-charging stage, the second voltage to the read bitlines connected to all the memory cells; and transmit, during the read-sensing stage, the third voltage to the read wordlines connected to the memory cells to be accessed and stop outputting the second voltage to the read bitlines connected to the memory cells to be accessed.

4. The memory according to claim 1, wherein:

the second transistor is an N-type transistor, the second voltage is greater than the first voltage, and the third voltage is less than the first voltage; or the second transistor is a P-type transistor, the second voltage is less than the first voltage, and the third voltage is greater than the first voltage.

5. The memory according to claim 1, wherein the at least one control circuit comprises a first control circuit, wherein the first control circuit is connected to the read bitline and the read wordline, and the first control circuit is configured to:

transmit, during the pre-processing stage, the first voltage to the read wordline and the read bitline based on a first control signal.

6. The memory according to claim 1, wherein the at least one control circuit comprises a second control circuit, wherein the second control circuit is connected to the read bitline, and the second control circuit is configured to:

transmit, during the pre-charging stage, the second voltage to the read bitline connected to the memory cell based on a second control signal; and stop, during the read-sensing stage, outputting the second voltage to the read bitline connected to the memory cell.

7. The memory according to claim 1, wherein the at least one control circuit comprises a third control circuit, wherein the third control circuit is connected to the read wordline, and the third control circuit is configured to:

transmit, during the read-sensing stage, the third voltage to the read wordline connected to the memory cell based on a third control signal.

8. The memory according to claim 1, wherein a gate of the first transistor in the memory cell is connected to the write wordline, and a second electrode of the first transistor is connected to the write bitline, and wherein:

in a case that the second transistor is an N-type transistor, the second voltage is greater than the reference voltage, and the third voltage is less than the reference voltage; or in a case that the second transistor is a P-type transistor, the second voltage is less than the reference voltage, and the third voltage is greater than the reference voltage.

9. The memory according to claim 1, further comprising:

a fourth control circuit, wherein the fourth control circuit is connected to the output terminal of the at least one sense amplifying unit and the write bitline, and the fourth control circuit is configured to:

write, based on a fourth control signal, read data back into a corresponding memory cell.

10. The memory according to claim 1, further comprising:

a fifth control circuit, wherein the fifth control circuit is connected to the output terminal of the at least one sense amplifying unit, and the fifth control circuit is configured to:

transmit, based on a selection signal, data output from the at least one sense amplifying unit to a data line to output read data.

11. The memory according to claim 1, wherein the at least one sense amplifier is correspondingly connected to one memory array, and the memory further comprises:

a reference voltage control circuit, wherein the reference voltage control circuit is connected to the at least one sense amplifying unit for transmitting the reference voltage to the at least one sense amplifying unit based on a reference voltage control signal.

12. An electronic device, comprising:

a memory, wherein the memory comprises:

at least one memory array;

at least one control circuit;

at least one sense amplifier, wherein the at least one sense amplifier comprises at least one sense amplifying unit;

at least one write bitline for write operations; and at least one write wordline for write operations, wherein the at least one memory array comprises a plurality of memory cells arranged in an array as well as a plurality of read wordlines and a plurality of read bitlines for read operations, wherein each of the memory cells comprises a first transistor and a second transistor, with a gate of the second transistor connected to a first electrode of the first transistor, a first electrode of the second transistor connected to a read wordline, and a second electrode of the second transistor connected to a read bitline, wherein the at least one control circuit is connected to the read wordline and the read bitline, and the at least one control circuit is configured to:

transmit, during a pre-processing stage, a first voltage to the read wordline and the read bitline;

transmit, during a pre-charging stage, a second voltage to the read bitline; and transmit, during a read-sensing stage, a third voltage to the read wordline; and, wherein the at least one sense amplifier is correspondingly connected to one memory array, wherein a first input terminal of each sense amplifying unit is connected to the read bitline, wherein a second input terminal of each sense amplifying unit is configured to receive a reference voltage, and wherein an output terminal of the sense amplifying unit is connected to the write bitline; or, wherein the at least one sense amplifier is correspondingly connected to two memory arrays, wherein a first input terminal of the at least one sense amplifying unit is connected to one read bitline, wherein a second input terminal of the at least one sense amplifying unit is connected to another read bitline for receiving the reference voltage via the another read bitline, and wherein a first output terminal of the at least one sense amplifying unit is connected to one write bitline, and a second output terminal of the at least one sense amplifying unit is connected to another write bitline.

13. The electronic device according to claim 12, wherein the at least one control circuit is further configured to:

stop, during the read-sensing stage, outputting the second voltage to the read bitline.

14. A method for accessing a memory, comprising:

pre-processing, during a pre-processing stage, a memory array and transmitting a first voltage to a plurality of read wordlines and a plurality of read bitlines, wherein the memory array comprises a plurality of memory cells arranged in an array;

pre-charging, during a pre-charging stage, the read bitlines connected to memory cells, wherein a pre-charging voltage is a second voltage; and outputting, during a read-sensing stage, a third voltage to the read wordlines connected to the memory cells, and accessing the memory cells based on changes in electrical signals on the read bitlines.

15. The method according to claim 14, further comprising:

stopping, during the read-sensing stage, outputting the second voltage to the read bitlines.

16. The method according to claim 14, wherein:

a second transistor is an N-type transistor, the second voltage is greater than the first voltage, and the third voltage is less than the first voltage; or the second transistor is a P-type transistor, the second voltage is less than the first voltage, and the third voltage is greater than the first voltage.

17. The method according to claim 14, wherein during the read-sensing stage, the method comprises:

controlling, after a preset time interval following the outputting of the third voltage, a sense amplifying unit for comparing a voltage on the read bitlines connected to the memory cells with a reference voltage and outputting data stored in the memory cells based on a comparison result.

18. The method according to claim 17, wherein comparing the voltage on the read bitlines connected to the memory cells with the reference voltage and outputting the data stored in the memory cells based on the comparison result, comprises:

outputting, when the voltage on the read bitlines connected to the memory cells is less than the reference voltage, a high-level signal, and transmitting, based on a selection signal, the high-level signal to a data line; or outputting, when the voltage on the read bitlines connected to the memory cells is greater than the reference voltage, a low-level signal, and transmitting, based on a selection signal, the low-level signal to a data line.

19. The method according to claim 18, wherein:

after outputting the high-level signal, the method further comprises:

controlling a first transistor in the memory cell to be conducted, and writing the high-level signal back into a first electrode of the first transistor via a write bitline; or after outputting the low-level signal, the method further comprises:

controlling a first transistor in the memory cell to be conducted, and writing the low-level signal back into a first electrode of the first transistor via a write bitline.

20. The method according to claim 18, wherein:

after outputting the high-level signal, the method further comprises:

controlling a first transistor in the memory cell to be conducted, and writing new data into a first electrode of the first transistor via a write bitline; or after outputting the low-level signal, the method further comprises:

controlling a first transistor in the memory cell to be conducted, and writing new data into a first electrode of the first transistor via a write bitline.

* * * * *